US011757567B2

(12) United States Patent
Seol et al.

(10) Patent No.: US 11,757,567 B2
(45) Date of Patent: Sep. 12, 2023

(54) DEVICES AND METHODS FOR ENCODING AND DECODING TO IMPLEMENT A MAXIMUM TRANSITION AVOIDANCE CODING WITH MINIMUM OVERHEAD

(71) Applicant: SAMSUNG ELECTRONICS CO., LTD., Suwon-si (KR)

(72) Inventors: Changkyu Seol, Osan-si (KR); Jiyoup Kim, Hwaseong-si (KR); Hyejeong So, Seoul (KR); Myoungbo Kwak, Seoul (KR); Pilsang Yoon, Hwaseong-si (KR); Sucheol Lee, Suwon-si (KR); Jinsoo Lim, Seoul (KR); Youngdon Choi, Seoul (KR)

(73) Assignee: Samsung Electronics Co., Ltd.

( * ) Notice: Subject to any disclaimer, the term of this patent is extended or adjusted under 35 U.S.C. 154(b) by 26 days.

(21) Appl. No.: 17/590,474

(22) Filed: Feb. 1, 2022

(65) Prior Publication Data

US 2022/0294554 A1 Sep. 15, 2022

(30) Foreign Application Priority Data

Mar. 10, 2021 (KR) .................. 10-2021-0031486
May 31, 2021 (KR) .................. 10-2021-0070262

(51) Int. Cl.
*H04L 1/00* (2006.01)
*G06F 1/03* (2006.01)

(52) U.S. Cl.
CPC .............. *H04L 1/0041* (2013.01); *G06F 1/03* (2013.01); *H04L 1/0045* (2013.01); *H04L 1/0057* (2013.01); *H04L 1/0084* (2013.01)

(58) Field of Classification Search
CPC ... H04L 1/0041; H04L 1/0045; H04L 1/0057; H04L 1/0084; G06F 11/08
See application file for complete search history.

(56) References Cited

U.S. PATENT DOCUMENTS

| 5,870,037 A | 2/1999 | Okazaki et al. |
| 9,252,802 B2 | 2/2016 | Hollis |
| 9,768,989 B2 | 9/2017 | Lincoln et al. |
| 10,297,294 B2 | 5/2019 | Hollis et al. |
| 10,404,505 B1 | 9/2019 | Wilson |
| 10,491,238 B2 | 11/2019 | Sudhakaran et al. |
| 10,547,387 B2 | 1/2020 | Vegas-Olmos et al. |
| 10,673,535 B2 | 6/2020 | Li et al. |
| 2006/0139186 A1 | 6/2006 | Hoyer |

(Continued)

OTHER PUBLICATIONS

European Search Report dated Aug. 4, 2022 Cited in Corresponding Application No. EP Patent Application No. 22160817.7.

*Primary Examiner* — Shelly A Chase
(74) *Attorney, Agent, or Firm* — Fish & Richardson P.C.

(57) ABSTRACT

Provided is a device and method for encoding and decoding to implement maximum transition avoidance coding with minimum overhead. An exemplary device performs encoding and/or decoding, by using sub-block lookup tables representing correlations between some bit values in a data burst and symbols, a combining lookup table selectively interconnecting the sub-block lookup tables based on remaining bit values of the data burst, and a codeword decoding lookup table designating the sub-block lookup tables corresponding to the symbols of each of received codewords.

20 Claims, 16 Drawing Sheets

(56) References Cited

U.S. PATENT DOCUMENTS

| | | | |
|---|---|---|---|
| 2011/0156934 A1* | 6/2011 | Bae | H04L 25/4908 341/58 |
| 2013/0275828 A1* | 10/2013 | Abbasfar | G06F 11/08 714/752 |
| 2020/0145111 A1* | 5/2020 | Franck | H04B 10/58 |
| 2020/0336212 A1 | 10/2020 | Yu et al. | |

* cited by examiner

| | d[0:1] | d[2:3] | d[4:5] | d[6:7] | d[8:9] | d[10:11] | d[12:13] | d[14:15] |
|---|---|---|---|---|---|---|---|---|
| DQ[0] | d0[0] | \multicolumn{3}{c}{d0[7:1]} | d0[8] | \multicolumn{3}{c}{d0[15:9]} |
| DQ[1] | d1[0] | d1[7:1] | | | d1[8] | d1[15:9] | | |
| DQ[2] | d2[0] | d2[7:1] | | | d2[8] | d2[15:9] | | |
| DQ[3] | d3[0] | d3[7:1] | | | d3[8] | d3[15:9] | | |
| DQ[4] | d4[0] | d4[7:1] | | | d4[8] | d4[15:9] | | |
| DQ[5] | d5[0] | d5[7:1] | | | d5[8] | d5[15:9] | | |
| DQ[6] | d6[0] | d6[7:1] | | | d6[8] | d6[15:9] | | |
| DQ[7] | d7[0] | d7[7:1] | | | d7[8] | d7[15:9] | | |

USER DATA 202

BB

| | s[0] | s[1] | s[2] | s[3] | s[4] | s[5] | s[6] | s[7] |
|---|---|---|---|---|---|---|---|---|
| DQ[0] | c0[7:0] | | | | c0[15:8] | | | |
| DQ[1] | c1[7:0] | | | | c1[15:8] | | | |
| DQ[2] | c2[7:0] | | | | c2[15:8] | | | |
| DQ[3] | c3[7:0] | | | | c3[15:8] | | | |
| DQ[4] | c4[7:0] | | | | c4[15:8] | | | |
| DQ[5] | c5[7:0] | | | | c5[15:8] | | | |
| DQ[6] | c6[7:0] | | | | c6[15:8] | | | |
| DQ[7] | c7[7:0] | | | | c7[15:8] | | | |
| DBI | d0[0] / d0[8] | d1[0] / d1[8] | d2[0] / d2[8] | d3[0] / d3[8] | d4[0] / d4[8] | d5[0] / d5[8] | d6[0] / d6[8] | d7[0] / d7[8] |

ENCODED DATA 204

| COMBINATION | USER DATA ||||||| 
|---|---|---|---|---|---|---|---|
| | b0 | b1 | b2 | b3 | b4 | b5 | b6 |
| A1×B1 (32) | X | X | X | X | X | 0 | 0 |
| | A1 ||| B1 ||||
| A1×B2 (16) | X | X | X | X | 0 | 0 | 1 |
| | A1 ||| B2 ||||
| A2×B1 (16) | X | X | X | X | 1 | 0 | 1 |
| | A2 || B1 |||||
| A3×B1 (16) | X | X | X | X | 0 | 1 | 0 |
| | A3 || B1 |||||
| A5×~B1 (16) | X | X | X | X | 1 | 1 | 0 |
| | A5 | ~B1 ||||||
| A1×B3 (8) | X | X | X | 0 | 0 | 1 | 1 |
| | A1 || B3 |||||
| A2×B2 (8) | X | X | X | 1 | 0 | 1 | 1 |
| | A2 | B2 |||||| 
| A4×B1 (8) | X | X | X | 0 | 1 | 1 | 1 |
| | B1 |||||||
| A2×B3 (4) | X | X | 0 | 1 | 1 | 1 | 1 |
| | A2 | B3 ||||||
| A3×B4 (4) | X | X | 1 | 1 | 1 | 1 | 1 |
| | A3 | B4 ||||||

| HALF CODEWORD | LUT | USER DATA | A1, A2 | | A3, A4 | | A5 | |
|---|---|---|---|---|---|---|---|---|
| | | | LUT | DATA | LUT | DATA | LUT | DATA |
| 00 | A3 | 0 | B1 | 000 | B1 | 000 | – | – |
| 01 | A1 | 00 | B1 | 001 | B1 | 001 | – | – |
| 02 | A1 | 10 | B1 | 100 | B1 | 100 | – | – |
| 03 | – | – | – | – | – | – | – | – |
| 10 | A3 | 1 | B1 | 010 | B1 | 010 | – | – |
| 11 | A1 | 01 | B1 | 011 | B1 | 011 | – | – |
| 12 | A2 | 0 | B1 | 111 | B1 | 111 | ~B1 | 110 |
| 13 | A5 | 0 | B2 | 10 | B4 | 1 | ~B1 | 101 |
| 20 | A4 | – | B1 | 101 | B1 | 101 | – | – |
| 21 | A1 | 11 | B1 | 110 | B1 | 110 | ~B1 | 111 |
| 22 | A2 | 1 | B2 | 00 | B4 | 0 | ~B1 | 011 |
| 23 | A5 | 1 | B2 | 11 | – | – | ~B1 | 010 |
| 30 | – | – | – | – | – | – | | |
| 31 | – | – | B2 | 10 | – | – | ~B1 | 100 |
| 32 | – | – | B3 | 0 | – | – | ~B1 | 001 |
| 33 | – | – | B3 | 1 | – | – | ~B1 | 000 |

3:4 BIT ENCODING

| DBI value | DBI MTA Codeword | |
|---|---|---|
| | Binary | PAM-4 |
| 000 | 0000 | 00 |
| 001 | 0001 | 01 |
| 010 | 0100 | 10 |
| 011 | 0101 | 11 |
| 100 | 0011 | 02 |
| 101 | 1100 | 20 |
| 110 | 1101 | 21 |
| 111 | 0111 | 12 |

DEVICES AND METHODS FOR ENCODING AND DECODING TO IMPLEMENT A MAXIMUM TRANSITION AVOIDANCE CODING WITH MINIMUM OVERHEAD

CROSS-REFERENCE TO RELATED APPLICATIONS

This application is based on and claims priority under 35 U.S.C. § 119 to Korean Patent Application Nos. 10-2021-0031486, filed on Mar. 10, 2021 and 10-2021-0070262, filed on May 31, 2021 in the Korean Intellectual Property Office, the disclosures of which are hereby incorporated by reference in their entirety.

BACKGROUND

The inventive concept relates to devices and methods, and more particularly, to devices and methods for encoding and decoding to implement a maximum transition avoidance coding with minimum overhead.

Efforts to make a computing system more powerful and more power efficient may result in developing interface communications and improving throughput without increasing power consumption, while at the same time reducing power consumption in the ideal case. A conventional system is implemented with pulse amplitude modulation 4-level (PAM-4) signaling. PAM-4 is used to convert a 2-bit stream into a single multi-level signal having a 4-level. A PAM-4 signaling system may use maximum transition avoidance (MTA) coding for removing maximum voltage transition between PAM-4 symbols on an interface line. The MTA coding may reduce inter-symbol interference (ISI) and crosstalk, which may cause signal distortion.

Among the various operations performed by a computing system, a memory access operation for data writing and/or reading is important. The memory access operation is performed based at least in part on the input/output structure of a memory, and when a memory bandwidth increases to 32 bits or more, the memory may be accessed by using a data modulation method. For example, when the PAM-4 signaling is used, large overhead may be generated due to an increase in the number of signal lines required for MTA coding and/or in a chip area. Accordingly, a device and method implemented with minimum overhead for transceiving 32-bit data by using the PAM-4 signaling, to which MTA is applied, is required.

SUMMARY

The inventive concept provides a device and method for encoding and decoding to implement maximum transition avoidance coding with minimum overhead.

The device includes a transmitter for a data bus, wherein the transmitter includes an encoder configured to convert data bursts to be transmitted to the data bus into codewords constituted by symbols. The encoder includes a logic circuit representing correlations between the data bursts and the symbols. The logic circuit includes: a plurality of sub-block lookup tables classified according to a number of codeword mappings, wherein the codeword mappings represent correlations between some bit values in the data bursts and the symbols; and a combination lookup table selectively interconnecting encoding results according to the plurality of sub-block lookup tables based on remaining bit values of each of the data bursts. The encoder is configured to provide the codeword corresponding to the data bursts to the data bus by using the combining lookup table and the plurality of sub-block lookup tables.

A method of transmitting data includes: receiving data bursts of m (m is a natural number) bits to be transmitted to a data line; transmitting values of p (p is a natural number and m>p) bits of the m bits of the data bursts to a data bus inversion (DBI) signal line; generating a codeword of the DBI signal line by performing q:(q+k) (q is a natural number and k is a natural number equal to or greater than 1) bit encoding on q bits, which is a sum of the p bits on the DBI signal line; and generating the codeword of the data line by performing (m−p):m bit encoding on the remaining (m−p) bits of each of the data bursts.

A device includes a receiver for a data bus, wherein the receiver includes a decoder configured to convert codewords constituted by symbols received by the data bus into data bursts. The decoder includes a logic circuit representing correlations between the symbols and the data bursts. The logic circuit includes: a codeword decoding lookup table configured to provide lookup table mapping, which designates second sub-block lookup tables corresponding to the symbols of each of the codewords; the sub-block lookup tables are classified according to a number of codeword mappings, wherein the codeword mappings represent correlations between the symbols and some bit values in the data bursts; and a combining lookup table selectively interconnecting the second sub-block lookup tables based on a combination of sub-block lookup tables designated by the lookup table mapping. The decoder restores the data bursts corresponding to the codeword by using the codeword decoding lookup table, the sub-block lookup table, and the combining lookup table.

BRIEF DESCRIPTION OF THE DRAWINGS

Embodiments of the inventive concept will be more clearly understood from the following detailed description taken in conjunction with the accompanying drawings in which:

FIG. 2 is a diagram of 7:8 bit encoding used by a PAM-4 encoder in FIG. 1;

DETAILED DESCRIPTION OF THE PREFERRED EMBODIMENTS

Figure 1:
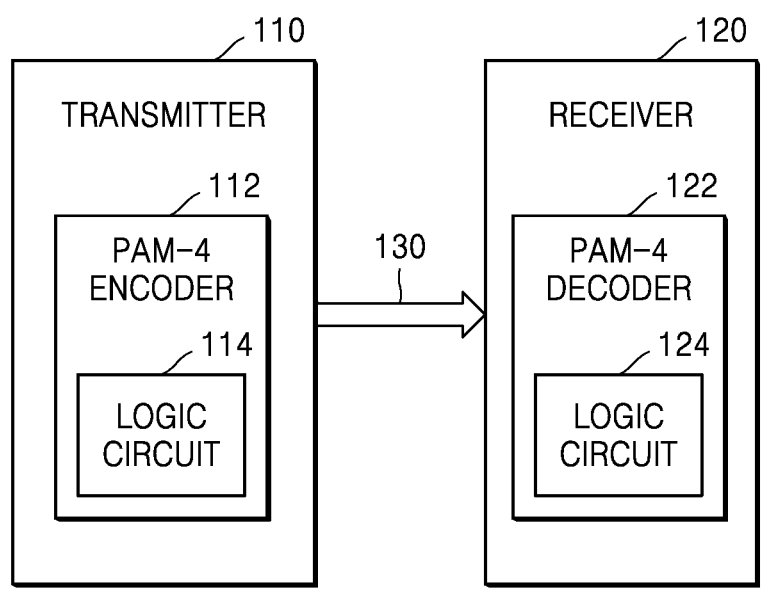
FIG. 1 is a schematic block diagram of a transmitter and a receiver according to an embodiment.

FIG. 1 is a schematic block diagram of a transmitter 110 and a receiver 120 according to an embodiment.

Referring to FIG. 1, the receiver 120 may communicate with the transmitter 110 via a channel line 130. The channel line 130 may include a plurality of signal lines, which physically or electrically connect the transmitter 110 to the receiver 120. The transmitter 110, the receiver 120, and the channel line 130 may support PAM-4 signaling, which converts 2-bit streams into a single multi-level signal having a 4-level.

The transmitter 110 may include a PAM-4 encoder 112 for converting data bursts, to be transmitted to the receiver 120, into PAM-4 symbols. The PAM-4 encoder 112 may perform encoding on the data burst and generate the PAM-4 symbols. The transmitter 110 may further include a driver for driving the PAM-4 symbols of the channel line 130. The transmitter 110 may transmit the PAM-4 symbols to the receiver 120 via the channel line 130.

The PAM-4 encoder 112 may include a logic circuit 114 representing correlations between the data bursts and the PAM-4 symbols. The logic circuit 114 may include lookup tables configured to have minimum overhead. The lookup tables may be implemented as registers (or storage elements) which store the correlations between the data bursts and the PAM-4 symbols. The PAM-4 encoder 112 may use the lockup tables and convert the data bursts into the PAM-4 symbols.

The receiver 120 may receive the PAM-4 symbols, and may include a PAM-4 decoder 122 for decoding the received PAM-4 symbols. The PAM-4 decoder 122 may include a logic circuit 124 configured to decode the PAM-4 symbols and recover the data bursts of the 2-bit streams. The logic circuit 124 may include look-up tables configured to decode the PAM-4 symbols and restore the data bursts of the 2-bit streams. The look-up tables may be implemented as registers, which store correlations between the PAM-4 symbols and the data bursts. The PAM-4 decoder 122 may use the look-up tables and restore the PAM-4 symbols to the data bursts. A portion of the look-up tables of the PAM-4 decoder 122 may be configured as identical to the look-up tables of the PAM-4 encoder 112.

FIG. 2 is a diagram of 7:8 bit encoding used by the PAM-4 encoder 112 in FIG. 1.

Referring to FIG. 2, a 7:8 bit encoding 200 between user data 202 and encoded data 204 is illustrated. The user data 202 may be referred to as original data. With respect to the user data 202 and the encoded data 204, each DQ[i] row may represent a serial data line.

In the user data 202, 16-bit data bursts may be arranged on each serial data line or each DQ[i] row, and columns may include sequential 2-bit positions in the 16-bit data bursts. For example, second and third bits of each data burst may be represented by d[2:3], which is column labeled. Each 16-bit data burst may be represented by two halves of data bursts each including 8 bits. For example, on a serial data line DQ[0], the 16-bit data burst may be split into a first half data burst, or d0[0]:d0[7:1], and a second half data burst, or d0[8]:d0[15:9]. Each of the half data bursts may be further split into a pair of 1-bit:7-bit. For example, on the serial data line DQ[0], the first half data burst or d0[0]:d0[7:1] may be split into d0[0] of a 1-bit value and d0[7:1] of a 7-bit value.

In the encoded data 204, DQ[i] rows may represent the serial data lines, a data bus inversion (DBI) row may represent a DBI signal line, and columns thereof may include bit strings representing symbols s[i]. For example, s[0] may represent a first 2-bit PAM-4 symbol on each serial data line, and s[1] may represent a second 2-bit PAM-4 symbol.

The 7:8 bit encoding 200 may encode a pair of 1-bit data values at any bit position on any one serial data line, to the PAM-4 symbol on the DBI signal line. For example, data d0[0] and d0[8] on the serial data line DQ[0] may be encoded to the 2-bit PAM-4 symbol on the DBI signal line, and the data d1[0] and data d1[8] of the serial data line DQ[1] may be encoded to the 2-bit PAM-4 symbol on the DBI signal line.

According to an embodiment, in the 7:8 bit encoding 200, the 2-bit PAM-4 symbol on the DBI signal line may encode a pair of 1-bit data values on other serial data lines, to the PAM-4 symbol on the DBI signal line. For example, data d0[0] of the serial data line DQ[0] and data d1[0] of the serial data line DQ[1] may be encoded to the 2-bit PAM-4 symbol on the DBI signal line. Similarly, data d2[0] of the serial data line DQ[2] and data d3[0] of the serial data line DQ[3] may be encoded to the 2-bit PAM-4 symbol on the DBI signal line.

In the 7:8 bit encoding 200, the remaining seven bits not used as the PAM-4 symbol of the DBI signal line of each of the first and second half data bursts may be encoded to four PAM-4 symbols on the serial data line corresponding thereto. The four PAM-4 symbols may have 8 bits, and may be referred to as a codeword. For example, user data d0[7:1] may be encoded to a codeword c0[7:0] on the serial data line DQ[0]. The codeword for each 7 bits of user data may be represented as four of PAM-4 symbols. The user data d0[7:1] may be encoded to the codeword c0[7:0] including symbols s[0], s[1], s[2], and s[3].

In the 7:8 bit encoding 200, a space between a codeword ci[7:0] for 7 bits of the first half data burst on each of the serial data lines DQ[i] and a codeword ci[15:8] for 7 bits of the second half data burst on each of the serial data lines DQ[i] may be referred to as a block boundary (BB).

Figure 3:
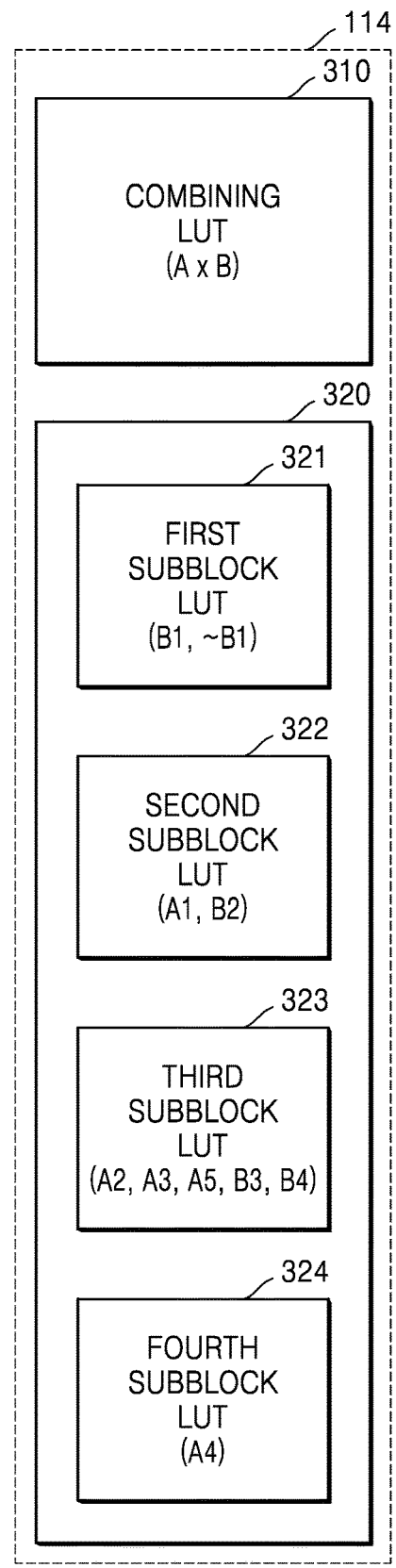
FIG. 3 is a diagram for explaining lookup tables of the PAM-4 encoder in FIG. 1.

The 7:8 bit encoding 200 may map a 7-bit data value to a codeword corresponding thereto by using look-up tables. As illustrated in FIG. 3, the lookup tables may include a combining lookup table (LUT) 310 and an LUT set 320 including a plurality of sub-block LUTs 321 through 324. The combining LUT 310 may selectively interconnect encoding results according to the plurality of sub-block LUTs 321 through 324.

On the other hand, in the 7:8 bit encoding 200, there may be 256 patterns according to 8-bit encoding of PAM-4 symbols s[0], s[1], s[2], and s[3], and 128 patterns, out of the 256 patterns, for 7-bit encoding of the user data may be selected. The selected 128 patterns may be provided to codewords of 7-bit user data. Registers related with unselected 128 patterns in the lookup tables may not be used, and may function as overhead of the lookup tables.

In embodiments described below, an example in which, to reduce the overhead of the lookup tables, the plurality of sub-block LUTs 321 through 324 are arranged adjacent to each other, that is, interconnected, to constitute one LUT set 320. Each of the sub-block LUTs 321 through 324 may include a plurality of sub-block LUTs A1 through A5, B1 through B4, and ~B, which are classified according to the number of codeword mappings. The combining LUT 310 may be constituted by LUT mapping which selectively combines the sub-block LUTs A1 through A5, B1 through B4, and ~B according to a type of a 7-bit user data value. The LUTs may be constituted to support the MTA, and mapping between the PAM-4 symbols and the symbol bits will be described with reference to FIG. 1. Table 1 is a non-limiting example for the purposes of description.

TABLE 1

| PAM-4 symbol levels | 0 | 1 | 2 | 3 |
|---|---|---|---|---|
| Symbol bits | 00 | 01 | 11 | 10 |
| Voltage level (% of power voltage VDD) | 0% | 27% | 44% | 50% |

Referring to Table 1, the 2-bit PAM-4 symbol may be transmitted to four voltage levels represented as 0, 1, 2, or 3 via the channel line (130 in FIG. 1). As an example, the PAM-4 symbol of a level 3 may be set to a highest voltage level, and the PAM-4 symbol of a level 0 may be set to a lowest voltage level.

FIG. 3 is a diagram of lookup tables of the PAM-4 encoder 112 in FIG. 1, and FIGS. 4 and 5A through 5C are diagrams of codeword encoding which uses the combining LUT 310 and the sub-block LUTs A1 through A5, B1 through B4, and ~B in FIG. 3. FIGS. 3 through 5C describe the LUTs used by 7:8 bit encoders and/or decoders, however these embodiments are non-limiting examples for the purpose of description. According to an embodiment, 29:32-bit encoders and/or decoders may be implemented by using the LUTs in FIGS. 3 through 5C.

Referring to FIG. 3, the logic circuit 114 of the PAM-4 encoder 112 may include the combining LUT 310 and first, second, third, and fourth sub-block LUTs 321, 322, 323, and 324, which are interconnected inside the LUT set 320. The first sub-block LUT 321 may include the sub-block LUTs B1 and ~B1 including the largest number of codeword mappings, for example, eight codeword mappings. The sub-block LUT ~B1 may be configured to provide codeword mapping that is reversed corresponding to the sub-block LUT B1. The sub-block LUT ~B1 may be configured to support MTA between the last symbol and the first symbol of a codeword in the sub-block LUTs to be combined. The second sub-block LUT 322 may include, for example, the sub-block LUTs A1 and B2, each including four codeword mappings. The third sub-block LUT 323 may include, for example, the sub-block LUTs A2, A3, A5, B3, and B4, each including two codeword mappings. The fourth sub-block LUT 322 may include, for example, the sub-block LUT A4 including one codeword mapping. The sub-block LUTs A1 through A5, B1 through B4, and ~B are described in detail with reference to FIGS. 5A through 5C.

Figure 4:
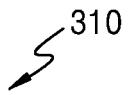
FIGS. 4 and 5A through 5C are diagrams for codeword encoding which uses a combination lookup table and sub-block lookup tables.

Referring to FIGS. 3 and 4, the combining LUT 310 may set the sub-block LUTs A1 through A5, B1 through B4, and ~B, which are combined according to a type of user data b[6:0], for providing the codeword mapping corresponding to the user data b[6:0] of 7 bits. The user data b[6:0] may correspond to the user data d0[7:1] of the half data burst described with reference to FIG. 2.

As an example, when a b5:b6 bit value of the user data b[6:0] of 7 bits is 00, the sub-block LUT A1 and the sub-block LUT B1 may be set as a combination. The sub-block LUT A1 may provide codeword mapping corresponding to a b0:b1 bit value. The sub-block LUT A1 may include four codeword mappings corresponding to 2 bits, and may be included in the second sub-block LUT 322. The sub-block LUT B1 may provide codeword mapping corresponding to a b2:b3:b4 bit value. The sub-block LUT B1 may include eight codeword mappings corresponding to 3 bits, and may be included in the first sub-block LUT 321. Accordingly, 32 (4*8=32) codewords constituted by a combination symbol encoding A1×B1 corresponding to the b5:b6 bit value, or 00, of the user data b[6:0] of 7 bits may be provided.

As an example, when a b4:b5:b6 bit value of the user data b[6:0] of 7 bits is 001, the sub-block LUT A1 and the sub-block LUT B2 may be set as a combination. The sub-block LUT A1 may provide codeword mapping corresponding to the b0:b1 bit value. The sub-block LUT B2 may provide codeword mapping corresponding to a b2:b3 bit value. The sub-block LUT B2 may include four codeword mappings corresponding to 2 bits, and may be included in the second sub-block LUT 322. Accordingly, 16 (4*4=16) codewords constituted by a combination symbol encoding A1×B2 corresponding to the b4:b5:b6 bit value, or 001, of the user data b[6:0] of 7 bits may be provided.

When the b4:b5:b6 bit value of the user data b[6:0] of 7 bits is 101, the sub-block LUT A2 and the sub-block LUT B1 may be set as a combination. The sub-block LUT A2 may provide codeword mapping corresponding to a b0 bit value. The sub-block LUT A2 may include two codeword mappings corresponding to 1 bit, and may be included in the third sub-block LUT 323. The sub-block LUT B1 may provide codeword mapping corresponding to a b1:b2:b3 bit value. Accordingly, 16 (2*8=16) codewords constituted by a combination symbol encoding A2×B1 corresponding to the b4:b5:b6 bit value, or 101, of the user data b[6:0] of 7 bits may be provided.

When the b4:b5:b6 bit value of the user data b[6:0] of 7 bits is 010, the sub-block LUT A3 and the sub-block LUT B1 may be set as a combination. The sub-block LUT A3 may provide codeword mapping corresponding to a b0 bit value. The sub-block LUT A3 may include two codeword mappings corresponding to 1 bit, and may be included in the third sub-block LUT 323. The sub-block LUT B1 may provide codeword mapping corresponding to the b1:b2:b3 bit value. Accordingly, 16 (2*8=16) codewords constituted by a combination symbol encoding A3×B1 corresponding to the b4:b5:b6 bit value, or 010, of the user data b[6:0] of 7 bits may be provided.

When the b4:b5:b6 bit value of the user data b[6:0] of 7 bits is 110, the sub-block LUT A5 and the sub-block LUT ~B1 may be set as a combination. The sub-block LUT A5 may provide codeword mapping corresponding to the b0 bit value. The sub-block LUT A5 may include two codeword mappings corresponding to 1 bit, and may be included in the third sub-block LUT 323. The sub-block LUT ~B1 may provide codeword mapping corresponding to the b1:b2:b3 bit value. The sub-block LUT ~B1 may include eight codeword mappings corresponding to 3 bits, and may be included in the first sub-block LUT 321. Accordingly, 16 (2*8=16) codewords constituted by a combination symbol encoding A5×~B1 corresponding to the b4:b5:b6 bit value, or 110, of the user data b[6:0] of 7 bits may be provided.

As an example, when a b3:b4:b5:b6 bit value of the user data b[6:0] of 7 bits is 0011, the sub-block LUT A1 and the sub-block LUT B3 may be set as a combination. The sub-block LUT A1 may provide codeword mapping corresponding to the b0:b1 bit value. The sub-block LUT B3 may provide codeword mapping corresponding to a b2 bit value. The sub-block LUT B3 may include two codeword mappings corresponding to 1 bit, and may be included in the third sub-block LUT 323. Accordingly, 8 (4*2=8) codewords constituted by a combination symbol encoding A1×B3 corresponding to the b3:b4:b5:b6 bit value, or 0011, of the user data b[6:0] of 7 bits may be provided.

As an example, when the b3:b4:b5:b6 bit value of the user data b[6:0] of 7 bits is 1011, the sub-block LUT A2 and the sub-block LUT B2 may be set as a combination. The sub-block LUT A2 may provide codeword mapping corresponding to a b0 bit value. The sub-block LUT B2 may provide codeword mapping corresponding to a b1:b2 bit value. Accordingly, 8 (4*2=8) codewords constituted by a combination symbol encoding A2×B2 corresponding to the b3:b4:b5:b6 bit value, or 1011, of the user data b[6:0] of 7 bits may be provided.

As an example, when the b3:b4:b5:b6 bit value of the user data b[6:0] of 7 bits is 0111, the sub-block LUT A4 and the sub-block LUT B1 may be set as a combination. The sub-block LUT A4 may include one codeword mapping, and may be included in the fourth sub-block LUT 324. The sub-block LUT B1 may provide codeword mapping corresponding to a b0:b1:b2 bit value. Accordingly, 8 (1*8=8) codewords constituted by a combination symbol encoding A4×B1 corresponding to the b3:b4:b5:b6 bit value, or 0111, of the user data b[6:0] of 7 bits may be provided.

As an example, when the b2:b3:b4:b5:b6 bit value of the user data b[6:0] of 7 bits is 01111, the sub-block LUT A2 and the sub-block LUT B3 may be set as a combination. The sub-block LUT A2 may provide codeword mapping corresponding to a b0 bit value. The sub-block LUT B3 may provide codeword mapping corresponding to a b1 bit value. Accordingly, 4 (2*2=4) codewords constituted by a combination symbol encoding A2×B3 corresponding to the b2:b3:b4:b5:b6 bit value, or 01111, of the user data b[6:0] of 7 bits may be provided.

When the b2:b3:b4:b5:b6 bit value of the user data b[6:0] of 7 bits is 11111, the sub-block LUT A3 and the sub-block LUT B4 may be set as a combination. The sub-block LUT A3 may provide codeword mapping corresponding to a b0 bit value. The sub-block LUT B4 may provide codeword mapping corresponding to the b1 bit value. The sub-block LUT B4 may include two codeword mappings corresponding to 1 bit, and may be included in the third sub-block LUT 323. Accordingly, 4 (2*2=4) codewords constituted by a combination symbol encoding A3×B4 corresponding to the b2:b3:b4:b5:b6 bit value, or 11111, of the user data b[6:0] of 7 bits may be provided.

Figure 5A:
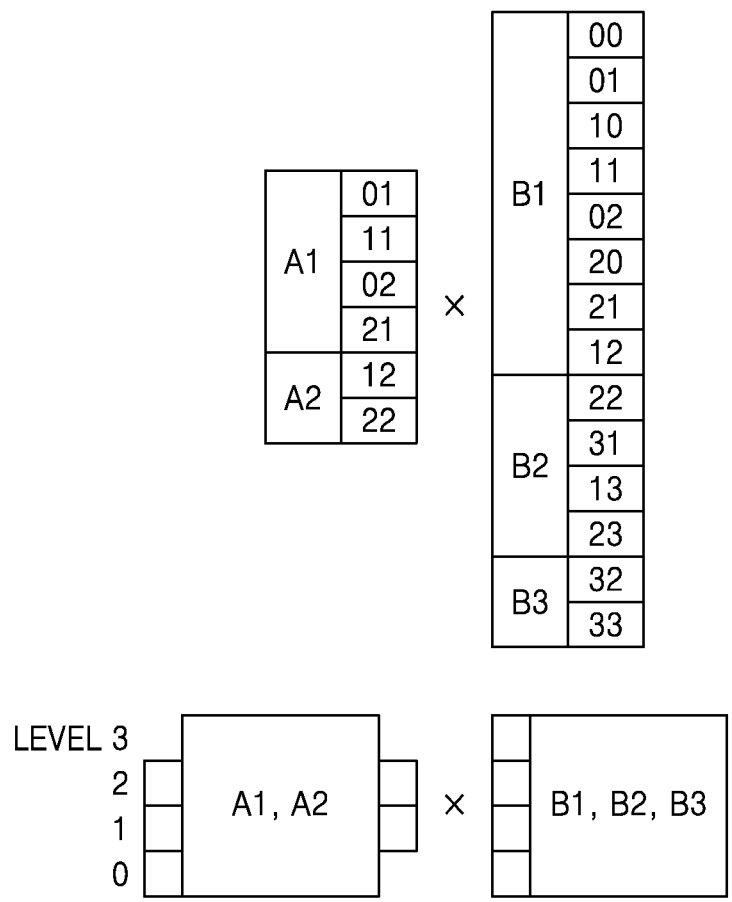

Referring to FIG. 5A, each of the sub-block LUTs A1 and A2 may be selectively combined with the sub-block LUTs B1, B2, and B3. Codeword encoding may be performed such that when a 2-bit value is 00, the sub-block LUT A1 is converted to a symbol level 01, when a 2-bit value is 01, the sub-block LUT A1 is converted to a symbol level 11, when a 2-bit value is 10, the sub-block LUT A1 is converted to a symbol level 02, and when a 2-bit value is 11, the sub-block LUT A1 is converted to a symbol level 21. Codeword encoding may be performed such that when a 1-bit value is 0, the sub-block LUT A2 is converted to a symbol level 12, and when a 1-bit value is 1, the sub-block LUT A2 is converted to a symbol level 22. The sub-block lookup tables A1 and A2 may be configured as a combination of the first symbol level 0, 1 or 2, and the last symbol level 1 or 2.

Codeword encoding may be performed such that when a 3-bit value is 000, the sub-block LUT B1 is converted to a symbol level 00, when a 3-bit value is 001, the sub-block LUT B1 is converted to a symbol level 01, when a 3-bit value is 010, the sub-block LUT B1 is converted to a symbol level 10, when a 3-bit value is 011, the sub-block LUT B1 is converted to a symbol level 11, when a 3-bit value is 100, the sub-block LUT B1 is converted to a symbol level 02, when a 3-bit value is 101, the sub-block LUT B1 is converted to a symbol level 20, when a 3-bit value is 110, the sub-block LUT B1 is converted to a symbol level 21, and when a 3-bit value is 111, the sub-block LUT B1 is converted to a symbol level 12. Codeword encoding may be performed such that when a 2-bit value is 00, the sub-block LUT B2 is converted to a symbol level 22, when a 2-bit value is 01, the sub-block LUT B2 is converted to a symbol level 31, when a 2-bit value is 10, the sub-block LUT B2 is converted to a symbol level 13, and when a 2-bit value is 11, the sub-block LUT B2 is converted to a symbol level 23. Codeword encoding may be performed such that when a 1-bit value is 0, the sub-block LUT B3 is converted to a symbol level 32, and when a 1-bit value is 1, the sub-block LUT B3 is converted to a symbol level 33. The sub-block LUTs B1 through B3 may be configured as a combination of first symbol levels 0, 1, 2, or 3.

In FIG. 5A, MTA may be supported, so that a maximum transition (MT) event does not occur from a level 0 to a level 3 or from the level 3 to the level 0 between symbols in each codeword of the sub-block LUTs A1 and A2, and the sub-block LUTs B1, B2, and B3. In addition, MTA may be supported, so that the MT event does not occur between the last symbol of codewords of the sub-block LUTs A1 and A2 and the first symbol of codewords of the sub-block LUTs B1, B2, and B3.

Figure 5B:
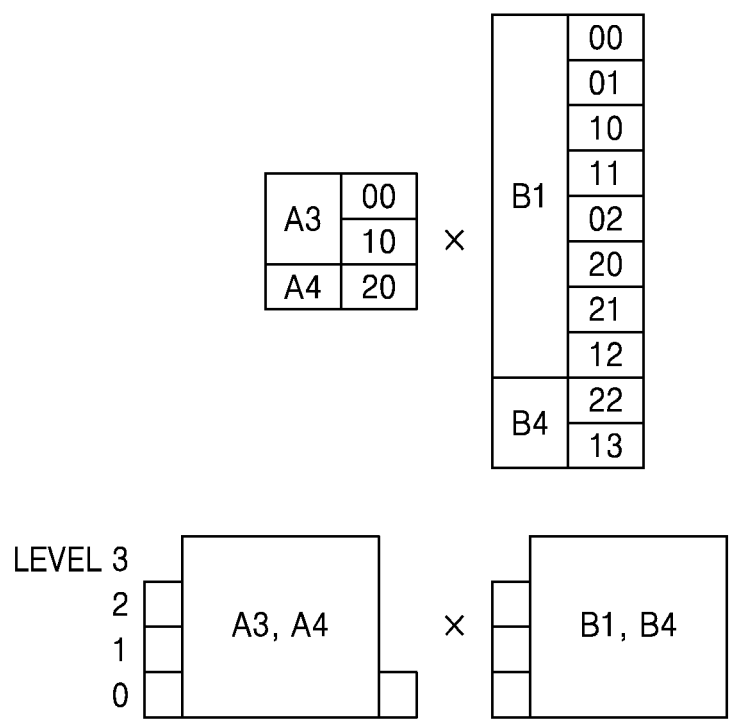

Referring to FIG. 5B, each of the sub-block LUTs A3 and A4 may be selectively combined with the sub-block LUTs B1 and B4. Codeword encoding may be performed such that when a 1-bit value is 0, the sub-block LUT A3 is converted to a symbol level 00, and when a 1-bit value is 1, the sub-block LUT A3 is converted to a symbol level 10. The sub-block LUT A4 may provide one symbol level 20. The sub-block LUTs A3 and A4 may be configured as a combination of first symbol levels 0, 1, or 2 and the last symbol level 0.

The configuration of the sub-block LUT B1 may be the same as described with reference to FIG. 5A. Codeword encoding may be performed such that when a 1-bit value is 0, the sub-block LUT B4 is converted to a symbol level 22, and when a 1-bit value is 1, the sub-block LUT B4 is converted to a symbol level 13. The sub-block LUTs B1 and B4 may be configured as a combination of first symbol levels 0, 1, or 2.

In FIG. 5B, the sub-block LUTs A3 and A4 and the sub-block LUTs B1 and B4 may support MTA between symbols in each codeword. In addition, MTA may be supported, so that the MT event does not occur between the last symbol of codewords of the sub-block LUTs A3 and A4 and the first symbol of codewords of the sub-block LUTs B1 and B4.

Figure 5C:
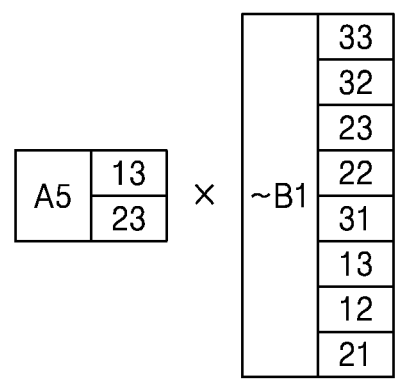
Figure 5C:
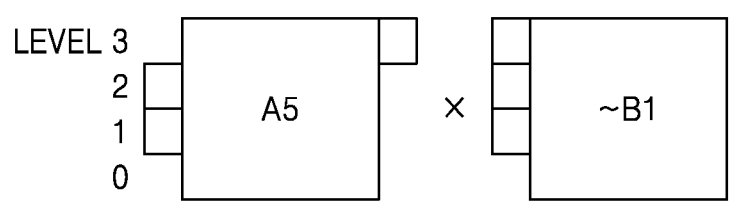

Referring to FIG. 5C, the sub-block LUT A5 may be selectively combined with the sub-block LUT ~B1. Codeword encoding may be performed such that when a 1-bit value is 0, the sub-block LUT A5 is converted to a symbol level 13, and when a 1-bit value is 1, the sub-block LUT A5 is converted to a symbol level 23. The sub-block LUT A5 may be configured as a combination of first symbol levels 1, or 2 and the last symbol level 3.

The sub-block LUT ~B1 may provide a codeword in which the symbol level of the sub-block LUT B1 described with reference to FIG. 5A is reversed. Codeword encoding may be performed such that when a 3-bit value is 000, the sub-block LUT ~B1 is converted to a symbol level 33, when a 3-bit value is 001, the sub-block LUT ~B1 is converted to a symbol level 32, when a 3-bit value is 010, the sub-block LUT ~B1 is converted to a symbol level 23, when a 3-bit value is 011, the sub-block LUT ~B1 is converted to a symbol level 22, when a 3-bit value is 100, the sub-block LUT ~B1 is converted to a symbol level 31, when a 3-bit value is 101, the sub-block LUT ~B1 is converted to a symbol level 13, when a 3-bit value is 110, the sub-block LUT ~B1 is converted to a symbol level 12, and when a 3-bit value is 111, the sub-block LUT ~B1 is converted to a symbol level 21. The sub-block LUT ~B1 may be configured as a combination of the first symbol levels 1, 2, or 3, and there may not be a symbol level 0 therein. The reason is, that because the last symbol level of the sub-block LUT A5 is 3, MTA may be supported by removing the symbol level 0 from the first symbol levels of the sub-block LUT ~B1.

7-bit user data may be encoded to a codeword with reference to FIGS. 3 through 5C. For example, when the 7-bit user data, or a b0:b1:b2:b3b4:b5:b6 bit value is 0010000, according to the b5:b6 bit value 00, the combination symbol encoding A1×B1 may be selected from the combining LUT 310. According to the b0:b1 bit value 00, the symbol level 01 of the sub-block LUT A1 may be selected, and according to the b2:b3:b4 bit value 100, the symbol level 02 of the sub-block LUT B1 may be selected. Accordingly, the 7-bit user data 0010000 may be converted to a codeword of a combination symbol 0102.

For example, if it is assumed that the b0:b1:b2:b3:b4:b5:b6 bit value of the 7-bit user data is 0101011. The combination symbol encoding A2×B2 may be selected from the combining LUT 310, according to the b3:b4:b5:b6 bit value 1011. According to the b0 bit value 0, the symbol level 12 of the sub-block LUT A2 may be selected, and according to the b1:b2 bit value 10, the symbol level 13 of the sub-block LUT B2 may be selected. Accordingly, the 7-bit user data 0101011 may be converted to a codeword of a combination symbol 1213.

For example, when 7-bit user data, or the b0:b1:b2:b3:b4:b5:b6 bit value is 1101010, according to the b4:b5:b6 bit value 010, the combination symbol encoding A3×B1 may be selected from the combining LUT 310. According to the b0 bit value 1, the symbol level 10 of the sub-block LUT A3 may be selected, and according to the b1:b2:b3 bit value 101, the symbol level 20 of the sub-block LUT B1 may be selected. Accordingly, the 7-bit user data 1101010 may be converted to a codeword of a combination symbol 1020.

For example, when the 7-bit user data, or the b0:b1:b2:b3:b4:b5:b6 bit value is 0000110, according to the b4:b5:b6 bit value 110, the combination symbol encoding A5×B1 may be selected from the combining LUT 310. According to the b0 bit value 0, the symbol level 13 of the sub-block LUT A5 may be selected, and according to the b1:b2:b3 bit value 000, the symbol level 33 of the sub-block LUT ~B1 may be selected. Accordingly, the 7-bit user data 0000110 may be converted to a codeword of a combination symbol 1333.

Figure 6:
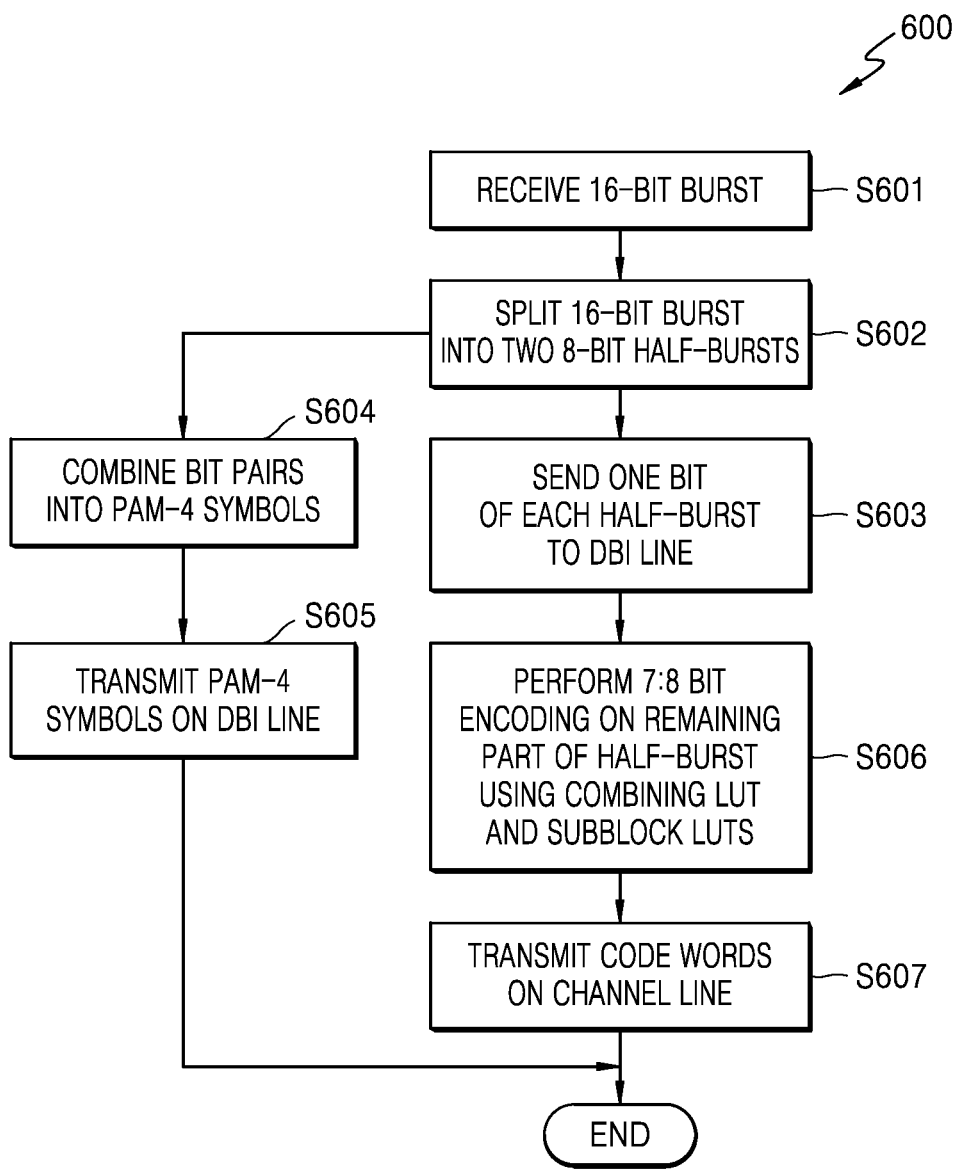
FIG. 6 is a flowchart of an operation method of the PAM-4 encoder in FIG. 1.

FIG. 6 is a flowchart of an operation method 600 of the PAM-4 encoder in FIG. 1.

Referring to FIG. 6 together with FIGS. 1 through 5C, the PAM-4 encoder 112 may receive the user data 16-bit data bursts to be transmitted to the serial data line DQ[i] (S601). The PAM-4 encoder 112 may split a 16-bit data burst into a first half data burst or d0[0]:d0[7:1] and a second half data burst or d0[8]:d0[15:9] (S602), and transmit one bit of each half data burst, for example, d0[0] and d0[8], to the DBI signal line (S603). The PAM-4 encoder 112 may combine a bit pair d0[0] and d0[8] into the PAM-4 symbol (S604), and transmit the PAM-4 symbol to the DBI signal line (S605).

The PAM-4 encoder 112 may perform 7:8 bit encoding which converts the remaining 7 bits unused for the PAM-4 symbol of the DBI signal line of each half of the data burst (S606). The 7:8 bit encoding may be performed by using the combining LUT 310 and the first through fourth sub-block LUTs 321 through 324 interconnected in the LUT set 320. A codeword corresponding to 7-bit data may be generated by the sub-block LUTs A1 through A5, B1 through B4, and ~B which are combined according to a type of the 7-bit data provided by the combining LUT 310. The PAM-4 encoder 112 may transmit the codeword to the channel line 130 (S607).

Figure 7:
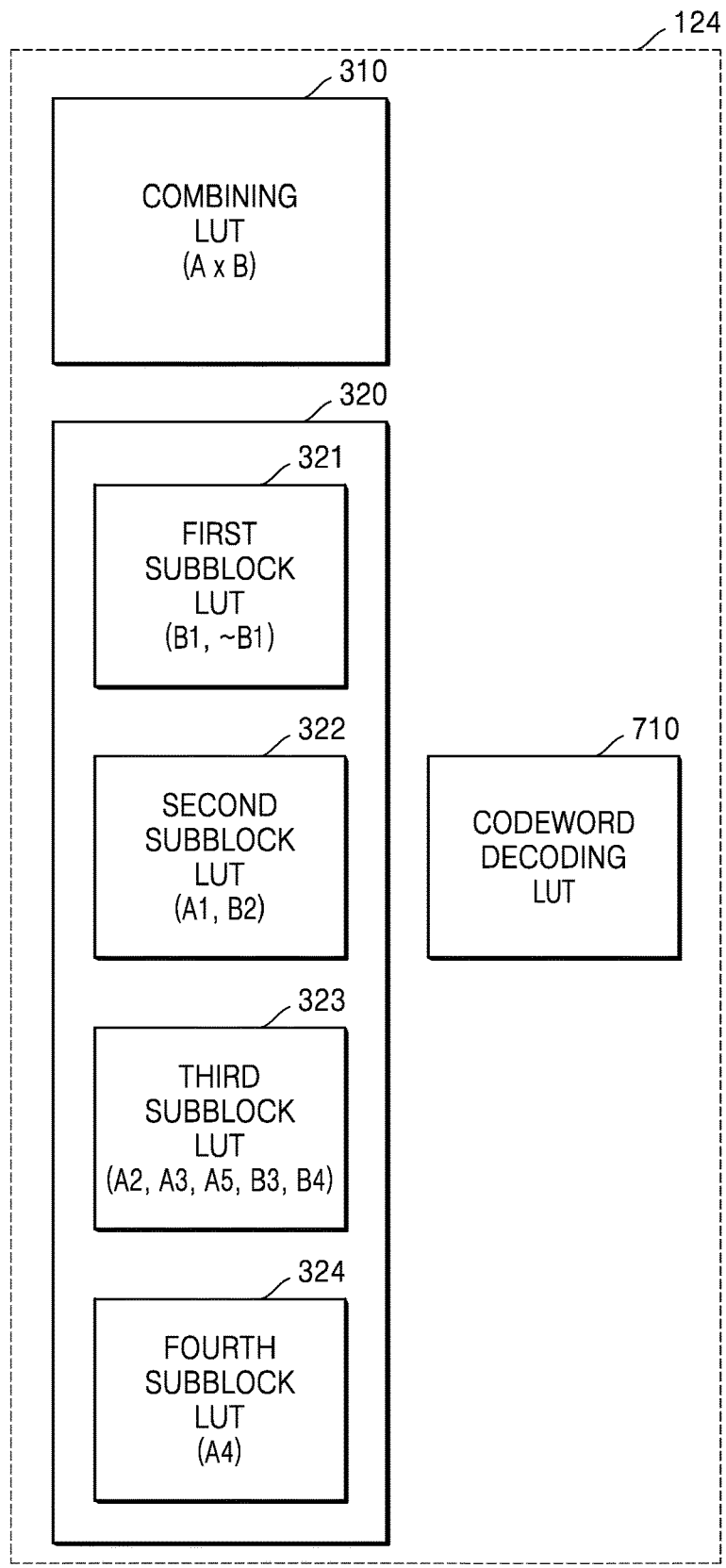
FIG. 7 is a diagram of lookup tables of the PAM-4 decoder in FIG. 1.
Figure 8:
FIG. 8 is a diagram of a codeword decoding lookup table in FIG. 7.

FIG. 7 is a diagram of lookup tables of the PAM-4 decoder 122 in FIG. 1, and FIG. 8 is a diagram of a codeword decoding LUT 710 in FIG. 7.

Referring to FIGS. 1 and 7, the logic circuit 124 of the PAM-4 decoder 122 may include the combining LUT 310, the LUT set 320, and the codeword decoding LUT 710. The combining LUT 310 and the LUT set 320 of the PAM-4 decoder 122 may be configured in the same manner as the combining LUT 310 and the LUT set 320 described above with reference to FIG. 3. The PAM-4 decoder 122 may receive the codeword encoded by the PAM-4 encoder 112 via the channel line 130, and perform 8:7 bit decoding corresponding to the codeword by using LUTs. The codeword decoding LUT 710 may be combined with the combining LUT 310 and the sub-block LUTs 321 through 324, and restore the data burst corresponding to the codeword.

Referring to FIG. 8, the codeword decoding LUT 710 may be configured to provide LUT mappings designating an LUT corresponding to the codeword and a user data bit value corresponding to the designated LUT. One of the sub-block LUTs A1 through A5 may be designated according to a combination of a first symbol level 0, 1, 2, and 3 and a second symbol level 0, 1, 2, and 3 of the codeword. For example, a codeword 00 may be designated to the sub-block LUT A3, and a user data bit value corresponding thereto may be set to 0. A codeword 12 may be designated to the sub-block LUT A2, and a user data bit value corresponding thereto may be set to 0.

The codeword decoding LUT 710 may provide LUT mappings 801 through 803 representing sub-block LUTs ~B1, and B1 through B4 which are combined with the sub-block LUTs A1 through A5.

The LUT mapping 801 may represent the sub-block LUTs B1 through B3 respectively combined with the sub-block LUTs A1 and A2, and may represent the user data bit value corresponding to each of the sub-block LUTs B1 through B3 combined with the sub-block LUT A1 or the sub-block LUT A2.

For example, a codeword 0102 may be decoded to a 7-bit user data bit with reference to the LUT mapping 801. Because the sub-block LUT A1 has been designated with reference to the previous codeword 01, the user data bit value corresponding thereto may be set to 00. The present codeword 02 may be designated to the sub-block LUT B1 combined with the sub-block LUT A1 with reference to the LUT mapping 801, and the user data bit value corresponding thereto may be set to 100. A codeword 0102 may be converted into 00100 in which a user data bit value 00 is combined with a user data bit value 100. The combined sub-block LUT A1×B1 may be converted into the user data bit value 00 with reference to the combining LUT (310 in FIG. 4). Accordingly, the codeword 0102 may be restored to the 7-bit user data bit value 0010000 in which the user data bit values 00100 and 00 are combined.

For example, in the case of a codeword 1213, when the sub-block LUT A2 is designated to the previous codeword 12, a user data bit value corresponding thereto may be set to 0. The present codeword 13 may be designated to the sub-block LUT B2 combined with the sub-block LUT A2 with reference to the LUT mapping 801, and the user data bit value corresponding thereto may be set to 10. The codeword 1213 may be converted into 010 after the user data bit values 0 and 10 are combined. The combined sub-block LUT A2×B2 may be converted into the user data bit value 1011 with reference to the combining LUT (310 in FIG. 4). Accordingly, the codeword 1213 may be restored to the 7-bit user data bit value 0101011 in which the user data bit values 010 and 1011 are combined.

The LUT mapping 802 may represent the sub-block LUTs B1 and B4 respectively combined with the sub-block LUTs A3 and A4, and may represent the user data bit value corresponding to each of the sub-block LUTs B1 and B4 combined with the sub-block LUT A3 or the sub-block LUT A4.

For example, a codeword 1020 may be decoded to a 7-bit user data bit with reference to the LUT mapping 802. Because the sub-block LUT A3 has been designated with reference to the previous codeword 10, the user data bit value corresponding thereto may be set to 1. The present codeword 20 may be designated to the sub-block LUT B1 combined with the sub-block LUT A3 with reference to the LUT mapping 802, and the user data bit value corresponding thereto may be set to 101. The codeword 1020 may be converted into a user data bit value 1101. The combined sub-block LUT A3×B1 may be converted into the user data bit value 010 with reference to the combining LUT (310 in FIG. 4). Accordingly, the codeword 1020 may be restored to the 7-bit user data bit value 1101010 in which the user data bit values 1101 and 010 are combined.

The LUT mapping 803 may represent the sub-block LUT ~B1 which is combined with the sub-block LUT A5.

For example, a codeword 1333 may be decoded to a 7-bit user data bit with reference to the LUT mapping 803. When the sub-block LUT A5 has been designated with reference to the previous codeword 13, the user data bit value corresponding thereto may be set to 0. The present codeword 33 may be designated to the sub-block LUT ~B1 combined with the sub-block LUT A5 with reference to the LUT mapping 803, and the user data bit value corresponding thereto may be set to 000. The codeword 1333 may be converted into a user data bit value 0000. The combined sub-block LUT A5×~B1 may be converted into the user data bit value 110 with reference to the combining LUT (310 in FIG. 4). Accordingly, the codeword 1333 may be restored to the 7-bit user data bit value 0000110 in which the user data bit values 0000 and 110 are combined.

Figure 9:
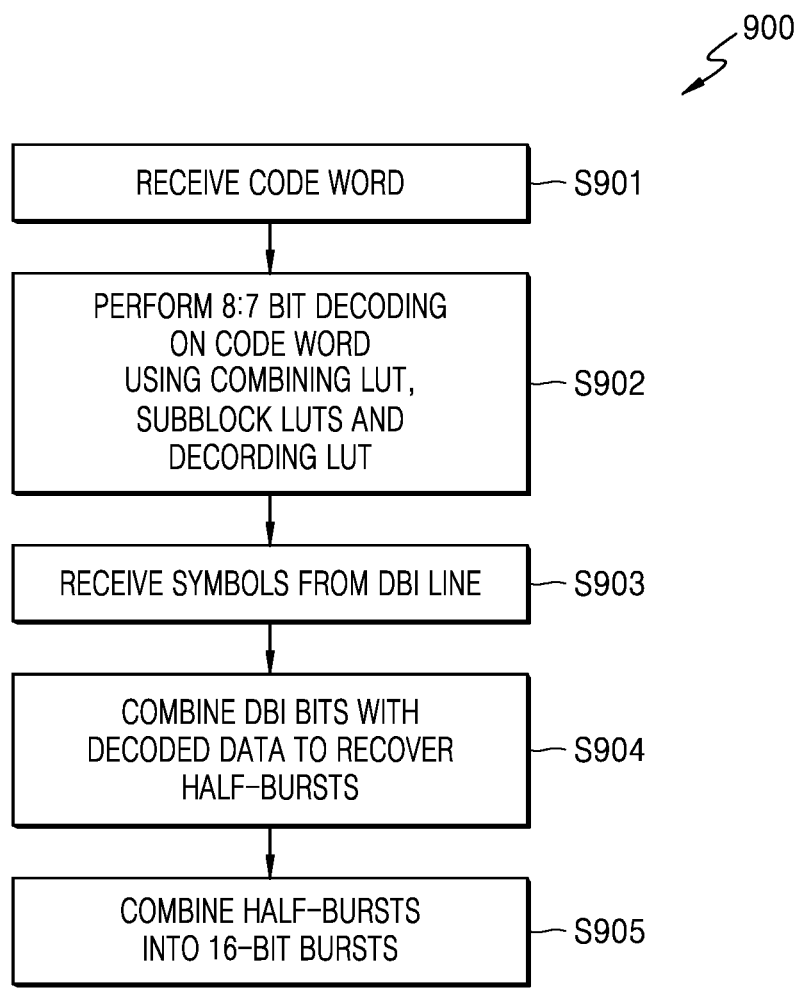
FIG. 9 is a flowchart of an operation method of the PAM-4 decoder in FIG. 1.

FIG. 9 is a flowchart of an operation method 900 of the PAM-4 decoder 122 in FIG. 1.

Referring to FIG. 9 together with FIGS. 1 through 8, the PAM-4 decoder 122 may receive a codeword via the serial data line DQ[i] (S901). The PAM-4 decoder 122 may perform the 8:7 bit decoding so that the codeword is converted into 7-bit user data (S902). The 8:7 bit decoding may be performed by using the codeword decoding LUT 710, the combining LUT 310, and the first through fourth sub-block LUTs 321 through 324 interconnected in the LUT set 320. The 7-bit user data corresponding to the codeword may be generated by the 8:7 bit decoding.

The PAM-4 decoder 122 may receive 1-bit user data of the PAM-4 symbol via the DBI signal line (S903), and may restore the first half data burst by combining the received 1-bit user data with the decoded user data (S904). The PAM-4 decoder 122 may restore the second half data bursts for the serial data line DQ[i], and restore complete data bursts by combining the first half data bursts with the second half data bursts (S905).

Figures 10, 11:
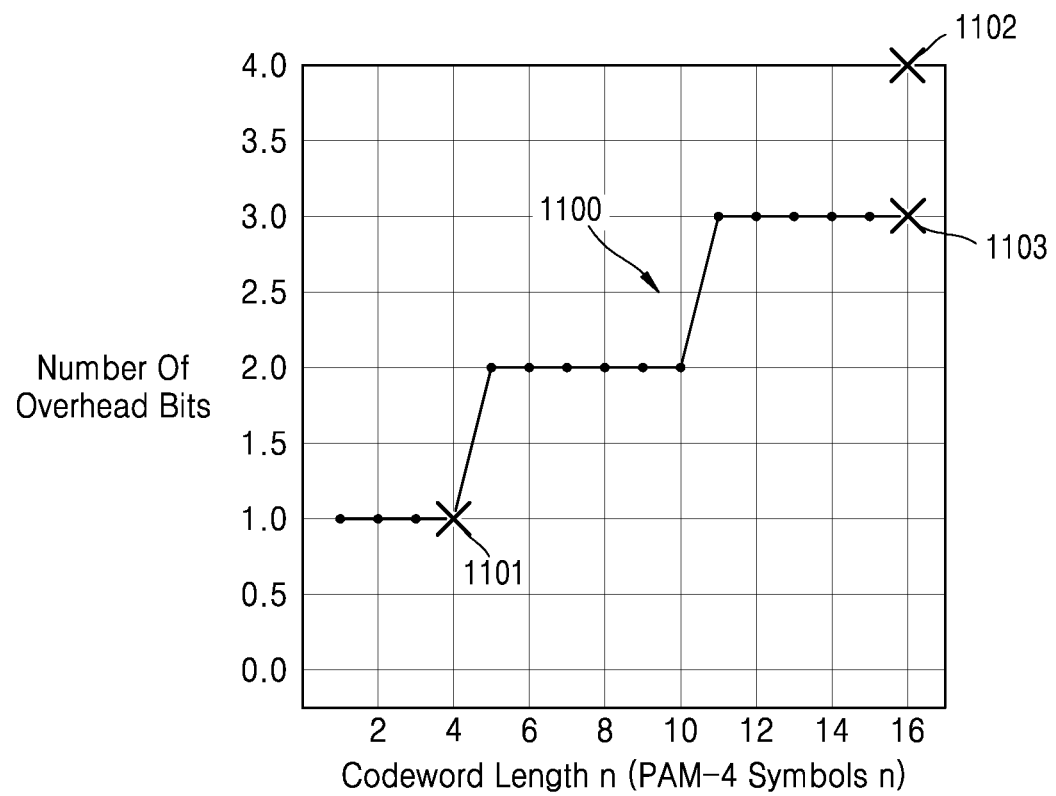
FIG. 10 is a diagram of an encoding method of 32-bit data burst by using the 7:8 bit encoding of FIG. 2.
FIG. 11 is a graph for explaining an encoding method of data burst, according to an embodiment.

FIG. 10 is a diagram of an encoding method of a 32-bit data burst by using the 7:8 bit encoding 200 of FIG. 2.

Referring to FIGS. 2 and 10, 32-bit data bursts may be arranged on each serial data line DQ[i], and each of the 32-bit data bursts may represent four quarter data bursts of 8 bits. Each of the quarter data bursts may be further split into a pair of 1 bit:7 bits, and may support MTA by performing the 7:8 bit encoding 200 described with reference to FIG. 2. A 1-bit value of each quarter data burst may be encoded to the PAM-4 symbol on the DBI signal line, and when 1 bit of each of the four quarter data bursts is transmitted to the DBI signal line on each of eight serial data lines DQ[i], a total of 32 bits may be transmitted to the DBI signal line.

To support MTA also on the DBI signal line, only 28 bits of the 32 bits may be used for the 7:8 bit encoding 200. Four bits, which are not used for the 7:8 bit encoding 200 on the DBI signal line, may be encoded to a symbol via a discrete signal line, for example, an error detection code (EDC) signal line. Accordingly, the encoding method of the 32-bit data burst of FIG. 10 may result in an occurrence of overhead requiring an additional signal line.

FIG. 11 is a graph for explaining an encoding method for a data burst, according to an embodiment.

Referring to FIGS. 1 and 11, the PAM-4 encoder 112 may perform (m−p):m (m is a natural number and p is less than m) bit encoding on the data bursts of m bits to be transmitted to a data line. The PAM-4 encoder 112 may transmit p bit values of the m bits to the DBI signal line, and for q bits, which is a sum of the p bits on the DBI signal line, may perform q:(q+k) (wherein k≥1) bit encoding and generate a codeword of the DBI signal line. The PAM-4 encoder 112 may perform (m−p):m bit encoding on the remaining (m−p) bits of each of the data bursts, and generate a codeword for a data line.

The PAM-4 encoder 112 may determine the p bits, based on a total number of codewords corresponding to the m bits of the data bursts, the number of codewords having the last symbol at the highest symbol level of the codewords having no MT event between the symbols, the number of codewords having the last symbol at intermediate levels, the number of codewords having the last symbol at the lowest symbol level, and the number of codewords having the first symbol at neither the highest symbol level nor the lowest symbol level. Accordingly, the (m−p):m bit encoding and the q:(q+k) bit encoding may be implemented as an MTA coding so that the MT event between the symbols does not occur.

The PAM-4 encoder 112 may be designed to have a 3-bit minimum overhead with respect to the 32-bit data burst during the PAM-4 symbol encoding. When the 29:32-bit encoder and/or decoder are directly designed based on the LUTs, tables of several gigabyte (GB) capacity may be required. To reduce the magnitude of tables, embodiments described with reference to FIGS. 3 through 5C, 7, and 8 may be applied to the 29:32-bit encoder and/or decoder. Accordingly, the magnitude of tables to be included in the 29:32-bit encoder and/or decoder may be reduced. When, for example, performing the PAM-4 symbol encoding by using Formulas 1 through 7 below, the PAM-4 encoder 112 may calculate the number of overhead bits according to a codeword length (or the number of the PAM-4 symbols) n.

In the case of the 32-bit data burst, the codeword length (or the number of the PAM-4 symbols) n may be 16.

The PAM-4 encoder 112 may define variables $h_n$, $m_n$, and $l_n$, to calculate patterns having no MT events for the codeword length n. $h_n$ may be the number of codewords of the symbol n without the MT event having the last symbol at a level 3, $m_n$ may be the number of codewords of the symbol n without the MT event having the last symbol at a level 1 or 2, and $l_n$ may be the number of codewords of the symbol n without the MT event having the last symbol at a level 0. Recurrence relations representing relations between variables $h_n$, $m_n$, and $l_n$ may be obtained by using Formula 1.

$$h_{n+1} = h_n + m_n$$
$$m_{n+1} = 2m_n + 2h_n + 2l_n$$
$$l_{n+1} = l_n + m_n \quad \text{[Formula 1]}$$

In this case, $h_1=1$, $m_1=2$, and $l_1=1$, wherein n represents the present symbol, and (n+1) represents a subsequent symbol.

$t_n$, which is the number of total codewords for the codeword length n, may be calculated by using Formula 1 and illustrated in Formulas 2 and 3.

$$\begin{bmatrix} h_n \\ m_n \\ l_n \end{bmatrix} = \begin{bmatrix} 1 & 1 & 0 \\ 2 & 2 & 2 \\ 0 & 1 & 1 \end{bmatrix}^{n-1} \begin{bmatrix} 1 \\ 2 \\ 1 \end{bmatrix} \quad \text{[Formula 2]}$$

In this case, n represents the present symbol, and (n−1) represents a previous symbol.

$$t_n = h_n + m_n + l_n \quad \text{[Formula 3]}$$

$t_n$, which is the number of total codewords according to Formulas 2 and 3, may correspond to the case where MTA is not considered on the block boundary (BB in FIG. 2), that is, there is not a constraint on the symbol level to be assigned to the first symbol. On the block boundary BB also, it may be necessary to support MTA to prevent the MT event between the last symbol of the previous codeword (n−1) and the first symbol of the present codeword n. To this end, when a condition without a level 3 (or a level 0) is added to the first symbol of the present codeword n, Formulas 2 and 3 may be changed to Formulas 4 and 5.

$$\begin{bmatrix} h'_n \\ m'_n \\ l'_n \end{bmatrix} = \begin{bmatrix} 1 & 1 & 0 \\ 2 & 2 & 2 \\ 0 & 1 & 1 \end{bmatrix}^{n-1} \begin{bmatrix} 0 \\ 2 \\ 1 \end{bmatrix} \quad \text{[Formula 4]}$$

$$t'_n \simeq h'_n + m'_n + l'_n \quad \text{[Formula 5]}$$

A number of overhead bits x may be calculated by using Formulas 6 and 7 based on $t_n$ of Formula 3 and $t'_n$ of Formula 5.

$$x = 2n - [\log t_n] \quad \text{[Formula 6]}$$

$$x = 2n - [\log t'_n] \quad \text{[Formula 7]}$$

The number of overhead bits x having an integer value with reference to the codeword length n, which is obtained by using Formulas 6 and 7, may be represented as a graph line 1100 in FIG. 11. As illustrated by the graph line 1100, the codeword length (or the number of the PAM-4 symbols) n of 16 may correspond to the number of overhead bits 3 (1103).

On the graph line 1100 in FIG. 11, the codeword length (or the number of the PAM-4 symbols) n of 4 according to the 7:8 bit encoding 200 of FIG. 2 may correspond to the number of overhead bits 1 (1101), and the number of overhead bits 1 may correspond to one bit of each of the half data bursts transmitted to the DBI signal line. In addition, when the 7:8 bit encoding 200 is applied to the 32-bit data burst described with reference to FIG. 10, it may be understood that the number of overhead bits is 4 (1102). To the contrary, when the PAM-4 symbol encoding is performed on the 32-bit data burst by using Formulas 1 through 7, the number of overhead bits may be reduced to 3 (1103). Accordingly, when 3 bits of the 32-bit data burst are transmitted from each of eight serial data lines DQ[i] to the DBI signal line, a total of 24 bits may be transmitted to the DBI signal line.

Figure 12:
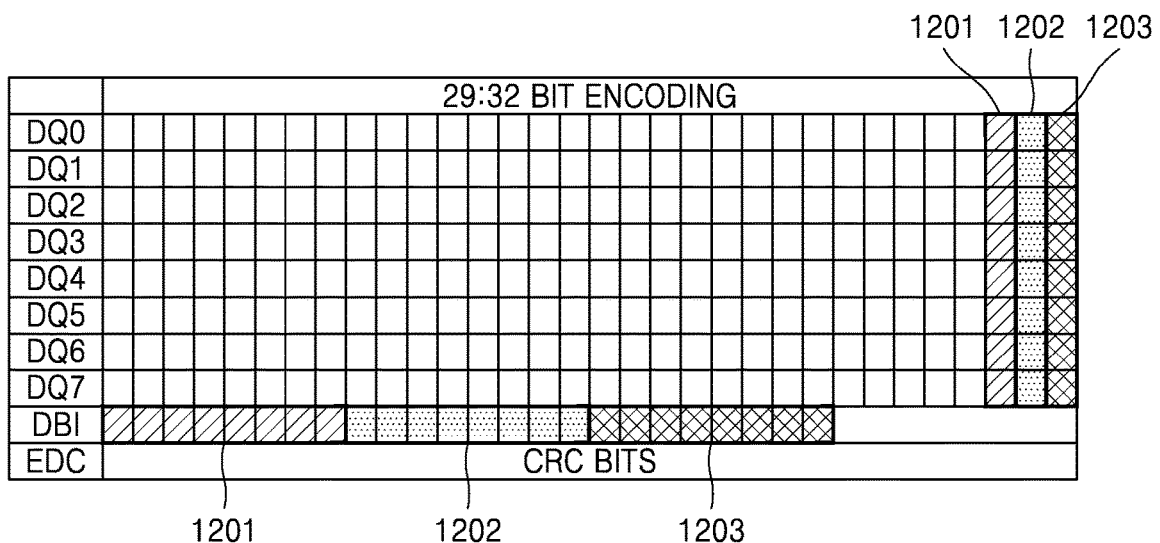
FIGS. 12 through 14 are diagrams of 32-bit data burst structures according to the encoding method of FIG. 11.
Figure 13:
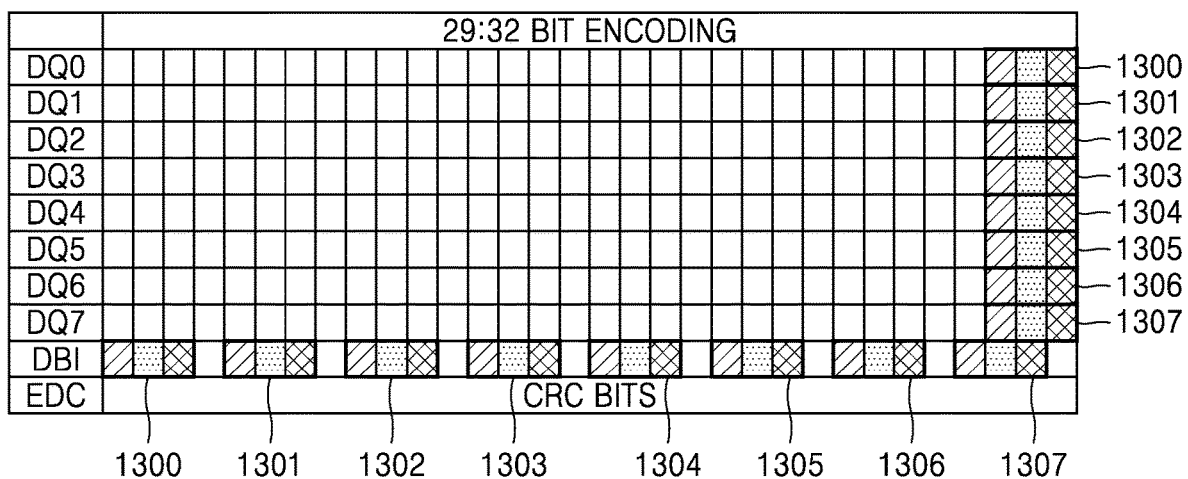
Figures 14, 15:
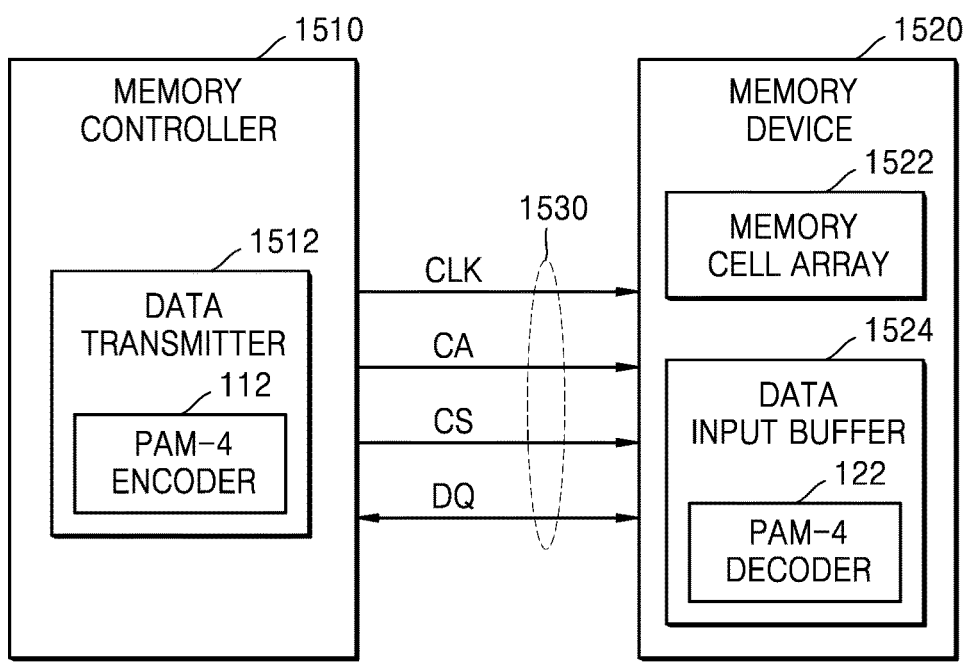
FIG. 15 is a block diagram of a first example of a memory system including encoding and decoding devices, according to an embodiment.

FIGS. 12 through 14 are diagrams of 32-bit data burst structures according to the encoding method of FIG. 11.

Referring to FIGS. 1 and 12, when the PAM-4 encoder 112 performs the encoding method described with reference to FIG. 11 and transmits 3 bits of the 32-bit data burst from each of eight serial data lines DQ[i] to the DBI signal line, a total of 24 bits may be transmitted to the DBI signal line. The PAM-4 encoder 112 may transmit first bit values 1201 of 3 bits of each of the serial data lines DQ[i] to the DBI signal line. Thereafter, second bits values 1202 of 3 bits of each of the serial data lines DQ[i] may be transmitted to the DBI signal line, and subsequently, third bit values 1203 may be transmitted to the DBI signal line. The PAM-4 encoder 112 may split 24 bits on the DBI signal line into eight 3-bit groups, and perform 3:4 bit encoding on each 3-bit group. The 3:4 bit encoding will be described with reference to FIG. 14.

Referring to FIG. 13, when the PAM-4 encoder 112 transmits 3 bits of the 32-bit data burst from each of eight serial data lines DQ[i] to the DBI signal line by performing the encoding method described with reference to FIG. 11, a total of 24 bits may be transmitted to the DBI signal line. The PAM-4 encoder 112 may transmit 3-bit values 1300 through 1307 of each of the serial data lines DQ[i] to the DBI signal line. The PAM-4 encoder 112 may perform the 3:4 bit encoding on the 3-bit values 1300 through 1307 on the DBI signal line.

Referring to FIG. 14, a 3:4 bit encoding 1400 may convert a 3-bit value 000 on the DBI signal line to a codeword having symbol bits 0000 and a symbol level 00. The 3:4 bit encoding 1400 may perform codeword encoding such that a 3-bit value 001 on the DBI signal line is converted into symbol bits 0001 and a symbol level 01, a 3-bit value 010 on the DBI signal line is converted into symbol bits 0100 and a symbol level 10, a 3-bit value 011 on the DBI signal line is converted into symbol bits 0101 and a symbol level 11, a 3-bit value 100 on the DBI signal line is converted into symbol bits 0011 and a symbol level 02, a 3-bit value 101 on the DBI signal line is converted into symbol bits 1100 and a symbol level 20, a 3-bit value 110 on the DBI signal line is converted into symbol bits 1101 and a symbol level 21, and a 3-bit value 111 on the DBI signal line is converted into symbol bits 0111 and a symbol level 12. In the 3:4 bit encoding 1400, the PAM-4 symbol having a level 3 of the highest voltage level may not be included in a codeword. Accordingly, the 3:4 bit encoding 1400 may support MTA on the DBI signal line.

The 32-bit data burst structure described with reference to FIGS. 12 and 13 may not require an additional signal line such as an EDC signal line, which is required for supporting MTA on the DBI signal line in the 7:8 bit encoding 200 of FIG. 10. In addition, the EDC signal line may be configured to be used for error detection of data DQ on the serial data line DQ[i]. The PAM-4 encoder 112 may provide performance improvement thereof, by generating checksum or cyclical redundancy check (CRC) for data DQ and transmitting certain CRC bits to the EDC signal line. Accordingly, the PAM-4 encoder 112 may satisfy the performance improvement thereof, by transmitting 3 bits of the 32-bit data burst of each of the serial data lines DQ[i] to the DBI signal line by performing the encoding method of FIG. 11, and supporting MTA on the DBI signal line by performing the 3:4 bit encoding 1400 on the DBI signal line.

FIG. 15 is a block diagram of a first example of a memory system 1500 including encoding and decoding devices, according to an embodiment.

Referring to FIG. 15, the memory system 1500 may include a memory controller 1510 and a memory device 1520. The memory system 1500 may be s an integrated circuit, an electronic device or a system, a smartphone, a tablet personal computer (PC), a computer, a server, a workstation, a portable communication terminal, a personal digital assistant (PDA), a portable multimedia player (PMP), a computing device such as other known computers, a virtual machine or a virtual computing device thereof, etc. Alternatively, the memory system 1500 may include some components included in a computing system such as a graphics card.

The memory controller 1510 may be connected to communicate with memory device 1520 via a channel or a memory bus 1530. For simplicity, in the drawing, a clock CLK, a command/address CA, and data DQ are illustrated as provided via one signal line between the memory controller 1510 and the memory device 1520, but may be actually provided via a plurality of signal lines or buses.

A CLK signal may be transmitted from the memory controller 1510 to the memory device 1520 via the CLK signal line of the memory bus 1530. A CA signal may be transmitted from the memory controller 1510 to the memory device 1520 via a CA bus of the memory bus 1530. A chip select (CS) signal may be transmitted from the memory controller 1510 to the memory device 1520 via the CS signal line of the memory bus 1530. The CS signal, which is activated to logic high, may indicate that the CA signal transmitted via the CA bus is a command. The data DQ may be transmitted from the memory controller 1510 to the memory device 1520 or from the memory device 1520 to the memory controller 1510, via a DQ bus of the memory bus 1530 and the DQ bus may include bidirectional signal lines.

The memory controller 1510 may include a data transmitter 1512 transmitting data DQ to the memory device 1520, and the data transmitter 1512 may include the PAM-4 encoder 112 configured to convert write data bursts to be transmitted to the memory device 1520 into the PAM-4 symbols. The PAM-4 encoder 112 may include the logic circuit 114 in FIG. 1, the combining LUT 310 and first through fourth sub-block LUTs 321 through 324, which are interconnected inside the LUT set 320, described with reference to FIGS. 3 through 5C. The PAM-4 encoder 112 may be configured to encode the write data bursts to the PAM-4 symbols, based on the operation method 600 of encoding described with reference to FIG. 6, the data burst structure described with reference to FIGS. 11 through 14, and a DBI MTA codeword. The memory controller 1510 may transmit the PAM-4 symbols encoded via the DQ bus as the data DQ to the memory device 1520.

The memory device 1520 may write or read the data DQ according to the control of the memory controller 1510. The memory device 1520 may include a memory cell array 1522 and a data input buffer 1524.

The memory cell array 1522 may include a plurality of word lines and a plurality of bit lines, and a plurality of memory cells formed at points where the word lines intersect with the bit lines. A memory cell of the memory cell array 1522 may include a volatile memory cell (for example, a dynamic random access memory (RAM) (DRAM) cell, a static RAM (SRAM) cell, or the like), a non-volatile memory cell (for example, a flash memory cell, a resistive RAM (RRAM) cell, a phase change RAM (PRAM) cell, a magnetic RAM (MRAM) cell, or the like), or a memory cell of any known different type.

The memory device 1520 may be configured to receive and decode the PAM-4 symbols transmitted to data input buffer 1524 via the DQ bus. The data input buffer 1524 may include the PAM-4 decoder 122 configured to restore the PAM-4 symbols to the write data bursts. The PAM-4 decoder 122 may include the logic circuit 124 in FIG. 1, the combining LUT 310 described with reference to FIGS. 7 and 8, the LUT set 320, and the codeword decoding LUT 710. The PAM-4 decoder 122 may be configured to decode the PAM-4 symbols to the write data bursts based on the operation method 900 of decoding, which is described with reference to FIG. 9. The data input buffer 1524 may provide the decoded write data bursts to be written in the memory cell array 1522.

Figure 16:
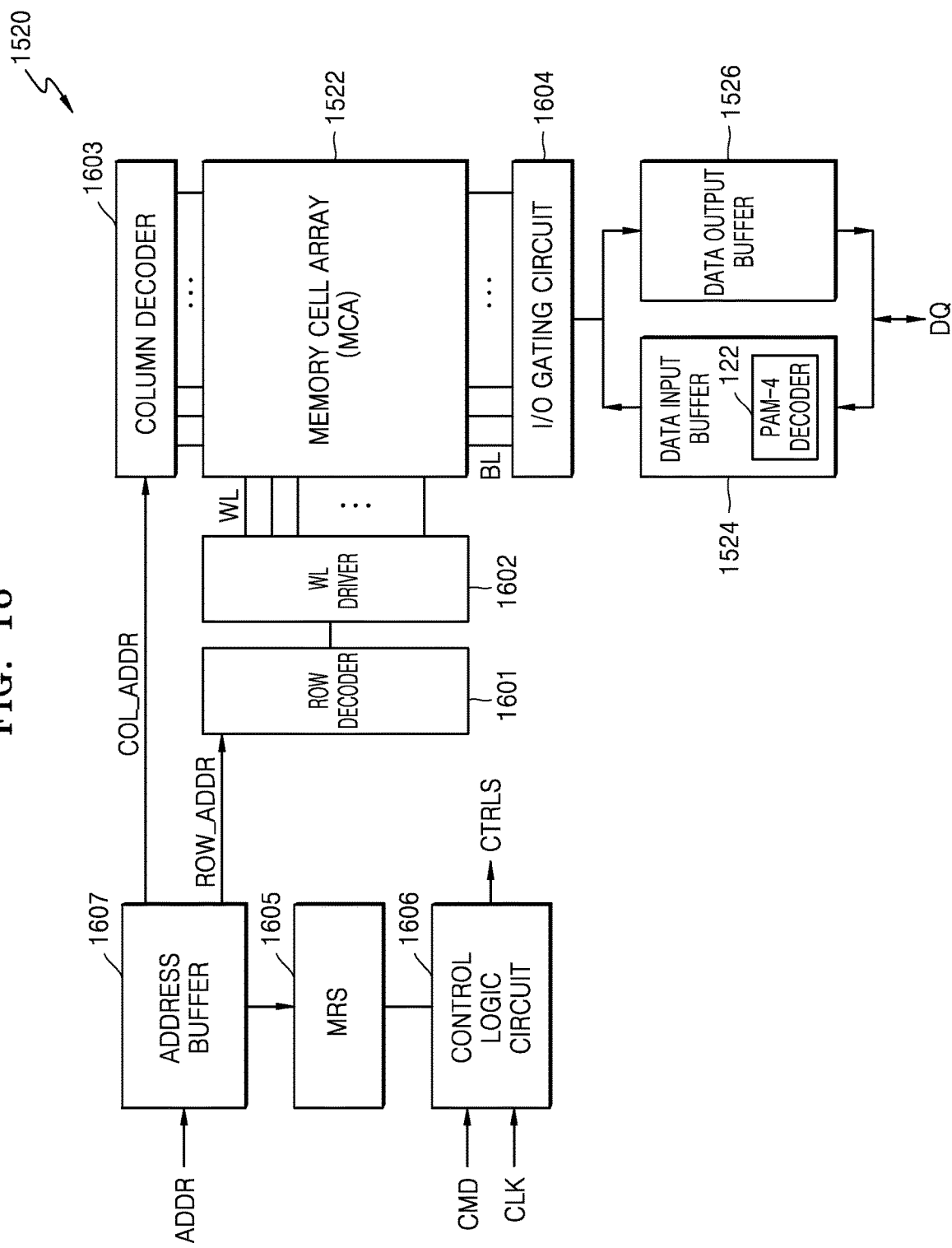
FIG. 16 is a block diagram of a portion of a memory device, according to an embodiment.

FIG. 16 is a block diagram of a portion of the memory device 1520, according to an embodiment.

Referring to FIG. 16, the memory device 1520 may include the memory cell array 1522, a row decoder 1601, a word line driver 1602, a column decoder 1603, an input/output gating circuit 1604, an MRS 1605, a control logic circuit 1606, an address buffer 1607, a data input buffer 1524, and a data output buffer 1526.

The memory cell array 1522 may include a plurality of memory cells provided in a form of a matrix arranged in rows and columns. The memory cell array 1522 may include a plurality of word lines WL and a plurality of bit lines BL, which are connected to memory cells. The plurality of word lines WL may be connected to the rows of the memory cells, and the plurality of bit lines BL may be connected to the columns of the memory cells.

The row decoder 1601 may select any one of the plurality of word lines WL connected to the memory cell array 1522. The row decoder 1601 may decode a row address ROW_ADDR received from the address buffer 1607 and select any one word line WL corresponding to the row address ROW_ADDR, and then, may be connected to the word line driver 1602 activating the selected word line WL. The column decoder 1603 may select certain bit lines BL among the plurality of bit lines BL. The column decoder 1603 may decode a column address COL_ADDR received from the address buffer 1607 and generate a column select signal, and then, may connect the bit lines BL selected by a column select signal to the input/output gating circuit 1604. The input/output gating circuit 1604 may include read data latches storing read data of the bit lines BL selected by the column select signal, and a write driver for writing write data in the memory cell array 1522. The read data stored in the read data latches of the input/output gating circuit 1604 may be provided to the DQ bus via the data output buffer 1526. Write data may be applied to the memory cell array 1522 via the data input buffer 1524 connected to the DQ bus and via the write driver of the input/output gating circuit 1604.

The control logic circuit 1606 may receive the CLK signal and a command CMD, and generate control signals CTRLS controlling operation timing and/or memory operation of the memory device 1520. The control logic circuit 1606 may read data from the memory cell array 1522 and write data in the memory cell array 1522 by using the control signals CTRLS.

To set operation conditions for the memory device 1520, the MRS 1605 may store information used by the control logic circuit 1606 for constituting an operation of the memory device 1520. The MRS 1605 may include various operations used to set operation conditions of the memory device 1520 and a register storing parameter codes for control parameters. The parameter code may be received by the memory device 1520 via the CA bus. The control logic circuit 1606 may provide the control signals CTRLS to circuits of the memory device 1520 such that the control logic circuit 1606 operates as configured by operation and control parameters, which are stored by the MRS 1605.

Figure 17:
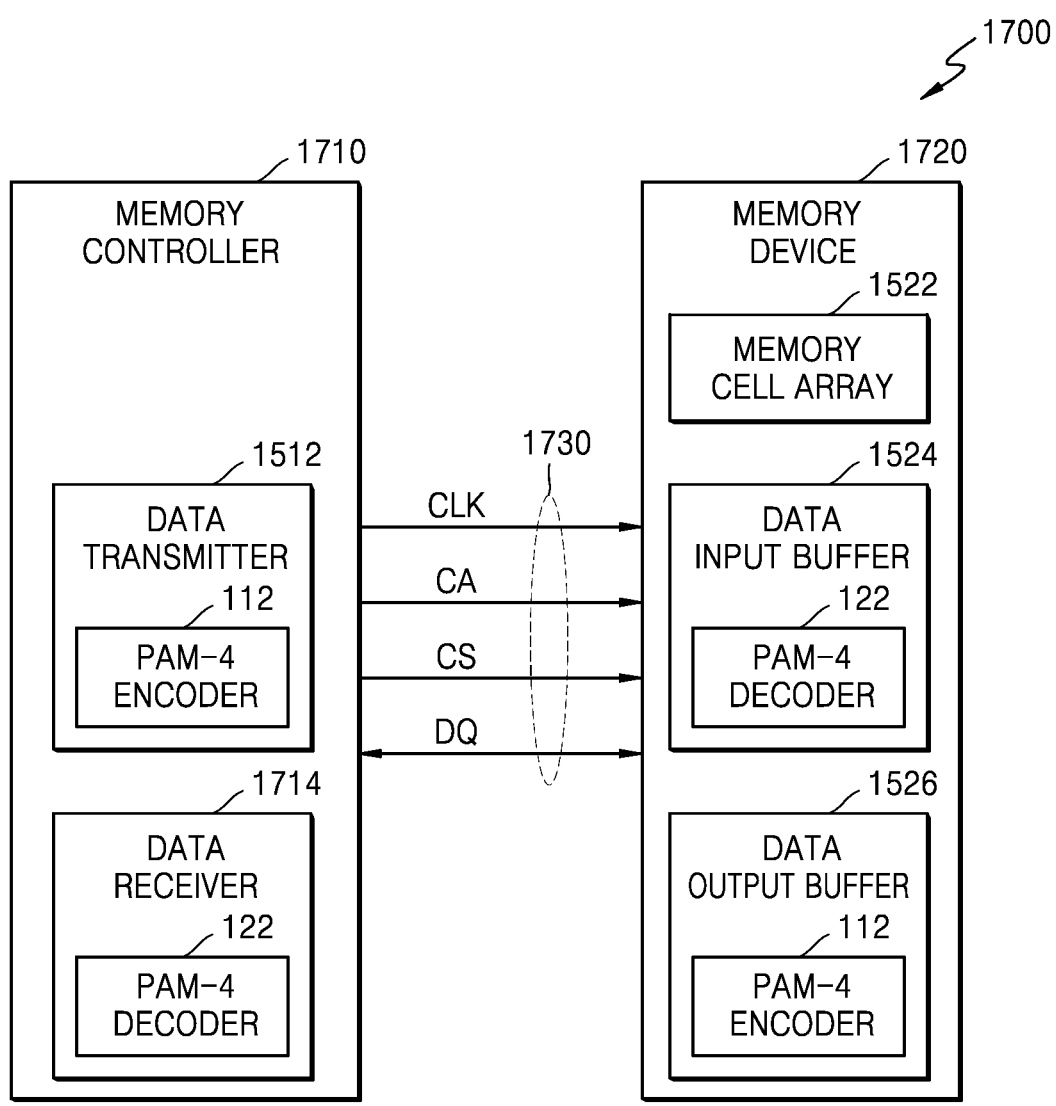
FIG. 17 is a block diagram of a second example of a memory system including encoding and decoding devices, according to an embodiment.

FIG. 17 is a block diagram of a second example of a memory system 1700 including encoding and decoding devices, according to an embodiment.

Referring to FIG. 17, the memory system 1700 may be different from the memory system 1500 of FIG. 15 in an aspect that a memory controller 1710 further includes a data receiver 1714 including the PAM-4 decoder 122, and a memory device 1720 further includes the data output buffer 1526 including the PAM-4 encoder 112.

When transmitting the read data bursts output from the memory cell array 1522 to the memory controller 1710, the memory device 1720 may be configured to encode the read data bursts to the PAM-4 symbols and transmit the encoded PAM-4 symbols via the data output buffer 1526. The data output buffer 1526 may include the PAM-4 encoder 112 configured to convert the read data into the PAM-4 symbols.

The memory controller 1710 may be configured to receive and decode the PAM-4 symbols transmitted to the data receiver 1714 via the DQ bus. The data receiver 1714 may include the PAM-4 decoder 122 configured to restore the PAM-4 symbols to the read data bursts.

While the inventive concept has been particularly shown and described with reference to embodiments thereof, it will be understood that various changes in form and details may be made therein without departing from the spirit and scope of the following claims.

What is claimed is:

1. A device comprising:
a transmitter for a data bus, the transmitter comprising an encoder configured to convert data bursts to be transmitted to the data bus into codewords constituted by symbols,
wherein the encoder comprises a logic circuit representing correlations between the data bursts and the symbols,
wherein the logic circuit comprises: a plurality of sub-block lookup tables classified according to a number of codeword mappings, wherein the codeword mappings represent correlations between some bit values in the data bursts and the symbols; and
a combination lookup table selectively interconnecting encoding results according to the plurality of sub-block lookup tables based on remaining bit values of each of the data bursts,
wherein the encoder is configured to provide the codeword corresponding to the data bursts to the data bus by using the combination lookup table and the plurality of sub-block lookup tables.

2. The device of claim 1, wherein the encoder is configured to encode a pair of 1-bit values to the symbol of a data bus inversion (DBI) signal line by transmitting a 1-bit value from each of 8 bits of the data bursts to the DBI signal line, perform 7:8 bit encoding on the remaining 7 bits of each of the data bursts, and generate the codeword constituted by four symbols having at least four levels according to the 7:8 bit encoding.

3. The device of claim 2, wherein the plurality of sub-block lookup tables, in which registers storing the codeword mappings are interconnected, constitute one lookup table set.

4. The device of claim 2, wherein the plurality of sub-block lookup tables comprise the codeword mappings representing the symbols corresponding to the some bit values of the remaining 7 bits of each of the data bursts, wherein the plurality of sub-block lookup tables comprise:
first sub-block lookup tables providing eight codeword mappings corresponding to 3-bit values of the some bit values;
second sub-block lookup tables providing four codeword mappings corresponding to 2-bit values of the some bit values;
third sub-block lookup tables providing two codeword mappings corresponding to 1-bit values of the some bit values; and
a fourth sub-block lookup table providing one codeword mapping having one symbol level.

5. The device of claim 4, wherein the plurality of sub-block lookup tables are configured by maximum transition avoidance (MTA) coding so that a maximum transition (MT) event does not occur from a level having a highest voltage level to a level having a lowest voltage level or from the level having the lowest voltage level to the level having the highest voltage level of the at least four levels between the symbols in the codeword mappings.

6. The device of claim 4, wherein the combining lookup table is configured to provide the codeword by combining the first sub-block lookup tables and the second sub-block lookup tables based on 2-bit values of the remaining bit values of each of the data bursts.

7. The device of claim 4, wherein the combining lookup table is configured to provide the codeword by combining the second sub-block lookup tables or combining the first sub-block lookup tables with the third sub-block lookup tables based on 3-bit values of the remaining bit values of each of the data bursts.

8. The device of claim 4, wherein the combining lookup table is configured to provide the codeword by combining the first sub-block lookup tables and the fourth sub-block lookup table or combining the second sub-block lookup tables and the third sub-block lookup tables based on 4-bit values of the remaining bit values of each of the data bursts.

9. The device of claim 4, wherein the combining lookup table is configured to provide the codeword by combining the third sub-block lookup tables based on 5-bit values of the remaining bit values of each of the data bursts.

10. The device of claim 1, wherein the device comprises a memory controller transmitting the codeword, to a memory device connected to the data bus as a write data.

11. The device of claim 1, wherein the device comprises a memory device transmiting the codeword to a memory controller connected to the data line as read data.

12. A method of transmitting data, the method comprising:
- receiving data bursts of m (m is a natural number) bits to be transmitted to a data line;
- transmitting values of p (p is a natural number and m>p) bits of the m bits of the data bursts to a data bus inversion (DBI) signal line;
- generating a codeword of the DBI signal line by performing q:(q+k) (q is a natural number and k is a natural number equal to or greater than 1) bit encoding on q bits, which is a sum of the p bits on the DBI signal line; and
- generating the codeword of the data line by performing (m-p):m bit encoding on remaining (m-p) bits of each of the data bursts.

13. The method of claim 12, wherein the (m-p):m bit encoding and the q:(q+k) bit encoding use symbols having at least four symbol levels, and are implemented by maximum transition avoidance (MTA) coding so that a maximum transition (MT) event does not occur from a symbol level having a highest voltage level to a symbol level having a lowest voltage level or from the symbol level having the lowest voltage level to the symbol level having the highest voltage level of the at least four symbol levels between the symbols.

14. The method of claim 13, further comprising determining the p bits,
- wherein the p bits are determined, based on a total number of codewords corresponding to the m bits, a number of codewords having a last symbol at a highest voltage level of the codewords having no MT event between the symbols, a number of codewords having the last symbol at intermediate levels between the symbol level having the highest voltage level and the symbol level having the lowest voltage level, a number of codewords having the last symbol at the lowest symbol level, and a number of codewords having a first symbol at neither the highest voltage level nor the lowest voltage level.

15. The method of claim 12, wherein the (m-p):m bit encoding is 29:32 bit encoding, and the q:(q+k) bit encoding is 3:4 bit encoding.

16. A device comprising a receiver for a data bus, the receiver comprising a decoder configured to convert codewords constituted by symbols received by the data bus into data bursts,
- wherein the decoder comprises a logic circuit representing correlations between the symbols and the data bursts, wherein the logic circuit comprises:
- a codeword decoding lookup table configured to provide lookup table mapping, which designates a plurality of sub-block lookup tables corresponding to the symbols of each of the codewords;
- the plurality of sub-block lookup tables being classified according to a number of codeword mappings, wherein the codeword mappings represent correlations between the symbols and some bit values in the data bursts; and
- a combining lookup table selectively interconnecting the plurality of sub-block lookup tables based on a combination of sub-block lookup tables designated by the lookup table mapping, wherein the decoder restores the data bursts corresponding to the codeword by using the codeword decoding lookup table, the plurality of sub-block lookup table, and the combining lookup table.

17. The device of claim 16, wherein the lookup table mapping is configured so that the codeword decoding lookup table designates one of the plurality of sub-block lookup tables according to a combination of first symbol levels and second symbol levels of the codeword.

18. The device of claim 16, wherein the plurality of sub-block lookup tables, in which registers storing the codeword mappings are interconnected, are configured as one lookup table set.

19. The device of claim 16, wherein the plurality of sub-block lookup tables comprise the codeword mappings representing some bit values of each of the data bursts corresponding to the symbol of the codeword, first sub-block lookup tables providing eight codeword mappings corresponding to 3-bit values of the some bit values;
- second sub-block lookup tables providing four codeword mappings corresponding to 2-bit values of the some bit values;
- third sub-block lookup tables providing two codeword mappings corresponding to 1-bit values of the some bit values; and
- a fourth sub-block lookup table providing one codeword mapping having one symbol level.

20. The device of claim 19, wherein the plurality of sub-block lookup tables are configured by maximum transition avoidance (MTA) coding so that a maximum transition (MT) event does not occur from a symbol level having a highest voltage level to a symbol level having a lowest voltage level or from the symbol level having the lowest voltage level to the symbol level having the highest voltage level between the symbols in the codeword mappings.

* * * * *